(12) United States Patent
Meyer et al.

(10) Patent No.: US 8,390,359 B2
(45) Date of Patent: Mar. 5, 2013

(54) LOW DISTORTION MOS ATTENUATOR

(75) Inventors: Robert G Meyer, Berkeley, CA (US);
Joel D Birkeland, North Plains, OR (US)

(73) Assignee: Maxim Integrated Products, Inc., San Jose, CA (US)

(*) Notice: Subject to any disclaimer, the term of this patent is extended or adjusted under 35 U.S.C. 154(b) by 224 days.

(21) Appl. No.: 12/771,852

(22) Filed: Apr. 30, 2010

(65) Prior Publication Data
US 2011/0156809 A1  Jun. 30, 2011

Related U.S. Application Data

(60) Provisional application No. 61/290,481, filed on Dec. 28, 2009.

(51) Int. Cl.
*H03L 5/00* (2006.01)

(52) U.S. Cl. ...................... 327/308; 333/81 R (58) Field of Classification Search .................. 327/306, 327/308; 333/81 R
See application file for complete search history.

(56) References Cited

U.S. PATENT DOCUMENTS

| | | | |
|---|---|---|---|
| 5,396,128 A | 3/1995 | Dunning et al. | |
| 5,461,338 A | 10/1995 | Hirayama et al. | |
| 5,576,635 A | 11/1996 | Partovi et al. | |
| 5,703,522 A | 12/1997 | Arimoto et al. | |
| 5,748,016 A | 5/1998 | Kurosawa | |
| 5,789,964 A | 8/1998 | Voldman | |
| 5,854,569 A | 12/1998 | Kohno et al. | |
| 6,075,414 A * | 6/2000 | Nagaoka et al. | 330/284 |
| 6,147,568 A * | 11/2000 | Souetinov | 333/81 R |
| 6,683,511 B2 * | 1/2004 | Souetinov et al. | 333/81 R |
| 7,205,817 B1 | 4/2007 | Huang et al. | |
| 2009/0308233 A1 | 12/2009 | Jacob | |

OTHER PUBLICATIONS

Bayruns,R.,et al,"The Bootstrapped Gate FET (BGFET)—A New Control Transistor," IEEE GaAs IC Symposium,1995, pp. 136-139.

* cited by examiner

*Primary Examiner* — Dinh T. Le
(74) *Attorney, Agent, or Firm* — Blakely Sokoloff Taylor & Zafman LLP (57) ABSTRACT

An attenuation circuit uses a voltage controlled variable resistance transistor as a signal attenuator for receivers operating in the zero Hz to about 30 MHz range. The transistor functions in the linear region to linearize the transistor resistance characteristics used for signal attenuation. In an exemplary application, the attenuation circuit is used as an RF attenuator for AM radio broadcast receivers and amplifiers with automatic gain control. Multiple attenuation circuits can be coupled in parallel, each attenuation circuit having a different sized variable resistance transistor, to form sequentially activated stages that increase the range of attenuation while minimizing distortion.

16 Claims, 5 Drawing Sheets

LOW DISTORTION MOS ATTENUATOR

RELATED APPLICATIONS

This application claims priority of U.S. provisional application Ser. No. 61/290,481, filed Dec. 28, 2009, and entitled "Low Distortion CMOS Attenuator", by these same inventors. This application incorporates U.S. provisional application Ser. No. 61/290,481 in its entirety by reference.

FIELD OF THE INVENTION

The present invention relates to the field of low distortion attenuators. More particularly, the present invention relates to the field of low distortion RF attenuators for a radio receiver.

BACKGROUND OF THE INVENTION

A low-noise amplifier (LNA) is an electronic amplifier used to amplify very weak signals, for example radio frequency (RF) signals captured by an antenna. In an exemplary application, an LNA is included in a front-end of an AM radio receiver. Using an LNA, the effect of noise from subsequent stages of the AM radio receiver is reduced by the gain of the LNA, while the noise of the LNA itself is injected directly into the received signal. Thus, it is necessary for an LNA to boost the desired signal power while adding as little noise and distortion as possible. This is accomplished by operating the LNA in its linear region.

Automatic gain control (AGC) is an adaptive means for adjusting the gain to an appropriate level for a range of input signal strength levels. In an AM radio receiver, the received signal strength varies from a weak to a strong signal. Without AGC, the sound emitted from the AM radio receiver varies according to the received signal strength. The AGC circuit detects the overall strength of the signal and automatically adjusts the gain to maintain an approximately constant average output level. For a very weak signal the AGC has no effect; as the signal increases, the AGC reduces the gain.

In order for the LNA to maintain operation in the linear region, input signals having too high a signal strength must be attenuated. Without such attenuation, input signals of sufficient signal strength overload the LNA, driving the LNA into a non-linear region and distorting the resulting amplified signal. In general, signal attenuation should reduce the amplitude or power of a signal without appreciably distorting the signal waveform.

As applied to an RF signal input to an LNA in an AM radio receiver, an objective is to vary the gain of the LNA by means of a variable attenuator in such a way that the RF signal input to the LNA is not distorted. Only the RF signal amplitude should be scaled, without creating any distortion product.

Figure 1:
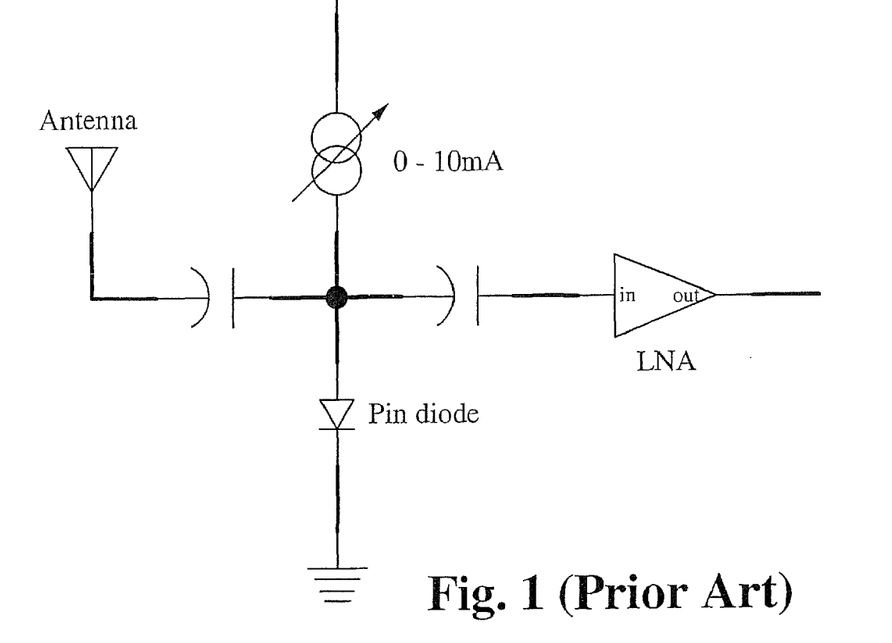
FIG. 1 illustrates an exemplary schematic diagram of a conventional AM radio receiver front-end.

The variable attenuation function found in conventional AM radio receiver front-ends is accomplished using a PIN diode as a variable resistor coupled to the input of the LNA. FIG. 1 illustrates an exemplary schematic diagram of a conventional AM radio receiver front-end. The PIN diode functions as a current controlled variable resistor. As the current is increased through the current regulator, the resistance of the PIN diode varies from several megohms at zero current to a relatively low value, such as a few tens of ohms, at 10 mA. As the resistance of the PIN diode decreases, more of the RF signal received by the antenna is shunted from the input of the LNA. In this sense, the variable resistance PIN diode functions as a signal attenuator. The variable resistance PIN diode reduces the input RF signal to prevent overloading of the LNA. Without the variable resistance PIN diode, an RF signal of sufficient signal strength may overload the LNA, driving the LNA into a non-linear region that results in distortion of the amplified signal.

Although effective in providing signal attenuation, the variable resistance PIN diode is an external component that is not part of the radio receiver integrated circuitry resulting in increased cost. Also, operation of the variable resistor PIN diode requires a significant amount of DC current. As such, the variable resistance PIN diode suffers from cost and power consumption issues. An alternative approach to the variable resistance PIN diode is to vary the gain of the LNA directly by changing the bias current in the LNA. However, this approach introduces distortion within the LNA.

SUMMARY OF THE INVENTION

An attenuation circuit uses a transistor configured as a voltage controlled variable resistor as a signal attenuator for receivers operating in the zero Hz to about 30 MHz range. The transistor functions in the linear region to linearize the transistor resistance characteristics used for signal attenuation. In an exemplary application, the attenuation circuit is used as an RF attenuator for AM radio broadcast receivers and amplifiers with automatic gain control. Multiple attenuation circuits can be coupled in parallel, each attenuation circuit having a different sized variable resistance transistor, to form sequentially activated stages that increase the range of attenuation while minimizing distortion.

In an aspect, a method of attenuating a signal is disclosed. The method includes attenuating the signal using a transistor as a variable resistor; scaling the signal using a scaling circuit coupled to the transistor; and applying the scaled signal with a DC bias signal to the transistor, thereby adjusting a resistance of the transistor that attenuates the signal. The coupled scaling circuit can be a DC coupled amplifier. The signal can be a radio frequency signal. A frequency of the signal can range from about zero Hz to about 30 MHz. The transistor can be a metal-oxide-semiconductor field-effect transistor. In some embodiments, the signal is supplied to a first terminal of the transistor and the scaled signal and DC bias signal are supplied to a second terminal of the transistor. The signal can be the signal received by an antenna. The attenuated signal can be supplied to an amplifier. A level of the DC bias signal regulates the resistance of the transistor. The scaled signal can cancel some or all of a distortion product generated by the transistor. The method can also include adjusting the DC bias signal to adjust the resistance of the transistor, thereby adjusting the attenuation of the signal. The coupled scaling circuit can include an active circuit and/or a passive circuit. The transistor can be coupled to provide a shunt resistance to the signal.

In some embodiments, the transistor, the scaling circuit, and a variable DC bias circuit that generates the DC bias signal form an attenuation circuit, and the method can also include coupling a plurality of attenuation circuits in parallel, each of the transistors in the plurality of attenuation circuits can have a different maximum resistance, further wherein the signal can be attenuated according to a shunt resistance resulting from an instantaneous resistance of all of the transistors in the plurality of attenuation circuits. The plurality of attenuation circuits can be configured as cascading stages, the transistor in each stage can be turned on sequentially in descending order of maximum resistance starting with a first transistor having a highest maximum resistance and ending with a last transistor having a lowest maximum resistance. In some embodiments, the transistor in each successive stage is turned on only after the transistor in the previous stage is fully turned on.

In another aspect, an attenuation circuit is disclosed. The attenuation circuit includes a signal supply configured to supply a signal; a scaling circuit coupled to the signal supply, wherein the scaling circuit is configured to scale the signal, thereby forming a scaled signal; a variable DC bias circuit configured to provide a DC bias signal; and a variable resistance transistor coupled to the scaling circuit to receive the scaled signal and coupled to the variable DC bias circuit to receive the DC bias signal, wherein the variable resistance transistor has an instantaneous resistance that varies according to the DC bias signal, further wherein the variable resistance transistor is coupled to the signal supply to attenuate the signal according to the instantaneous resistance. The signal can be a radio frequency signal. The signal supply can be an antenna. The signal supply can be coupled to a first terminal of the variable resistance transistor, and the scaling circuit and the variable DC bias circuit are coupled to a second terminal of the variable resistance transistor. An amplifier can be coupled to the first terminal of the variable resistance transistor to receive the attenuated signal. In some embodiments, the variable resistance transistor is coupled to the signal supply and to the amplifier to provide a shunt resistance to the signal. The scaling circuit can be DC coupled to the variable resistance transistor. A frequency of the signal can range from zero Hz to about 30 MHz. The variable resistance transistor can be a metal-oxide-semiconductor field-effect transistor. The scaled signal can cancel some or all of a distortion product generated by the variable resistance transistor. In some embodiments, an attenuation level of the signal increases as the instantaneous resistance of the variable resistance transistor decreases. The scaling circuit can include an active circuit and/or a passive circuit.

In yet another aspect, a signal attenuator is disclosed. The signal attenuator includes a signal supply configured to supply a signal; and a plurality of attenuation circuits coupled in parallel to the signal supply. Each attenuation circuit includes a scaling circuit coupled to the signal supply, wherein the scaling circuit is configured to scale the signal, thereby forming a scaled signal; a variable DC bias circuit configured to provide a DC bias signal; and a variable resistance transistor coupled to the scaling circuit to receive the scaled signal and coupled to the variable DC bias circuit to receive the DC bias signal, wherein the variable resistance transistor has an instantaneous resistance that varies according to the DC bias signal; further wherein each of the plurality of variable resistance transistors has a different maximum resistance, and each of the plurality of variable resistance transistors is coupled to the signal supply to attenuate the signal according to a shunt resistance resulting from the instantaneous resistance of all of the plurality of variable resistance transistors. In some embodiments, the plurality of variable resistance transistors are configured as cascading stages turned on sequentially in descending order of maximum resistance starting with a first variable resistance transistor having a highest maximum resistance and ending with a last variable resistance transistor having a lowest maximum resistance. In some embodiments, the variable resistance transistor in each successive stage is turned on only after the variable resistance transistor in the previous stage is fully turned on.

DETAILED DESCRIPTION OF THE EMBODIMENTS

Embodiments of the present application are directed to an attenuator. Those of ordinary skill in the art will realize that the following detailed description of the attenuator is illustrative only and is not intended to be in any way limiting. Other embodiments of the attenuator will readily suggest themselves to such skilled persons having the benefit of this disclosure.

Reference will now be made in detail to implementations of the attenuator as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Embodiments of an attenuation circuit use a voltage controlled variable resistance transistor as a signal attenuator for receivers operating in the zero Hz to about 30 MHz range. The attenuation circuit is configured such that the transistor functions in the linear region to linearize the transistor resistance characteristics used for signal attenuation. In some embodiments, the variable resistance transistor is a metal-oxide-semiconductor field-effect transistor (MOSFET). Any type of MOSFET can be implemented. In an exemplary application, the attenuation circuit is used as an RF attenuator for AM radio broadcast receivers and amplifiers with automatic gain control. It is understood that the concepts described in terms of a radio receiver can be extended to other frequency ranges and other signal attenuation applications. In some embodiments, multiple attenuation circuits, each attenuation circuit having a different sized variable resistance transistor, are coupled in parallel to form sequentially activated stages that increase the range of attenuation while minimizing distortion.

Figure 2:
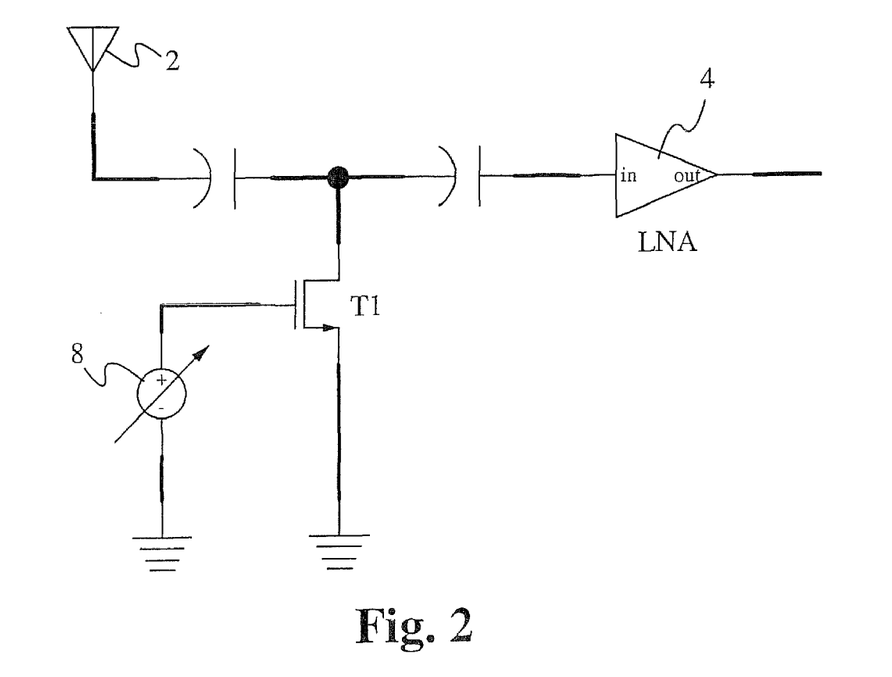
FIG. 2 illustrates a conceptual schematic diagram of a first embodiment of a receiver front-end.

FIG. 2 illustrates a conceptual schematic diagram of a first embodiment of a receiver front-end. A RF signal received by an antenna 2 is supplied to an amplifier, such as a low noise amplifier (LNA) 4. A transistor T1 is used as a variable resistor to properly attenuate the RF signal received by the antenna 2 prior to inputting to the LNA 4. In some embodiments, the transistor T1 is a MOSFET. A variable voltage source 8 varies a DC bias voltage supplied to the gate of the transistor T1.

Varying the gate voltage varies the resistance of the transistor T1. The lower the resistance of the transistor T1, the higher the attenuation of the RF signal supplied to the LNA 4.

Figure 3:
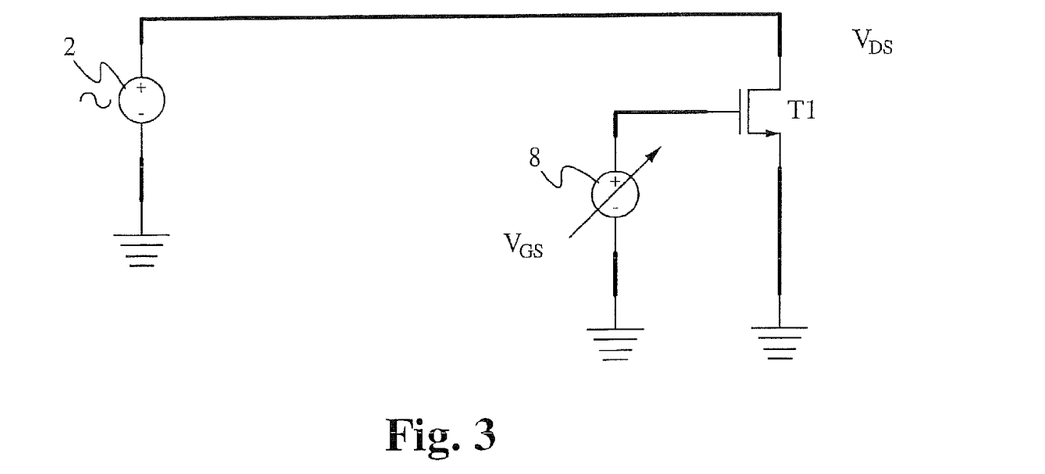
FIG. 3 illustrates a modified version of FIG. 2 showing the characteristics of equation (1) as applied to the transistor T1.

For an ideal square-law device, the transistor drain current $i_D$ is represented by equation (1):

$$i_D = (\mu C_{ox} W/L)[(V_{GS} - V_T)V_{DS} - 0.5 V_{DS}^2] \quad (1)$$

where $V_{GS}$ is the voltage supplied to the gate of the transistor $T_1$, $V_{DS}$ is the drain to source voltage of the transistor $T_1$, $V_T$ is the threshold voltage, $\mu$ is the carrier mobility, $C_{OX}$ is the oxide capacitance, W is the transistor gate width, and L is the transistor gate length. The squared term, $0.5 V_{DS}^2$, in equation (1) represents second order distortion. The second order distortion is the inherent distortion of the transistor T1 when used as a variable resistor for signal attenuation. FIG. 3 illustrates a modified version of FIG. 2 showing the characteristics of equation (1) as applied to the transistor T1. The antenna can conceptually be replaced by an AC signal supply, shown in FIG. 3 as signal supply 2. The problem that needs to be overcome is the distortion that is generated in the transistor T1.

Figure 4:
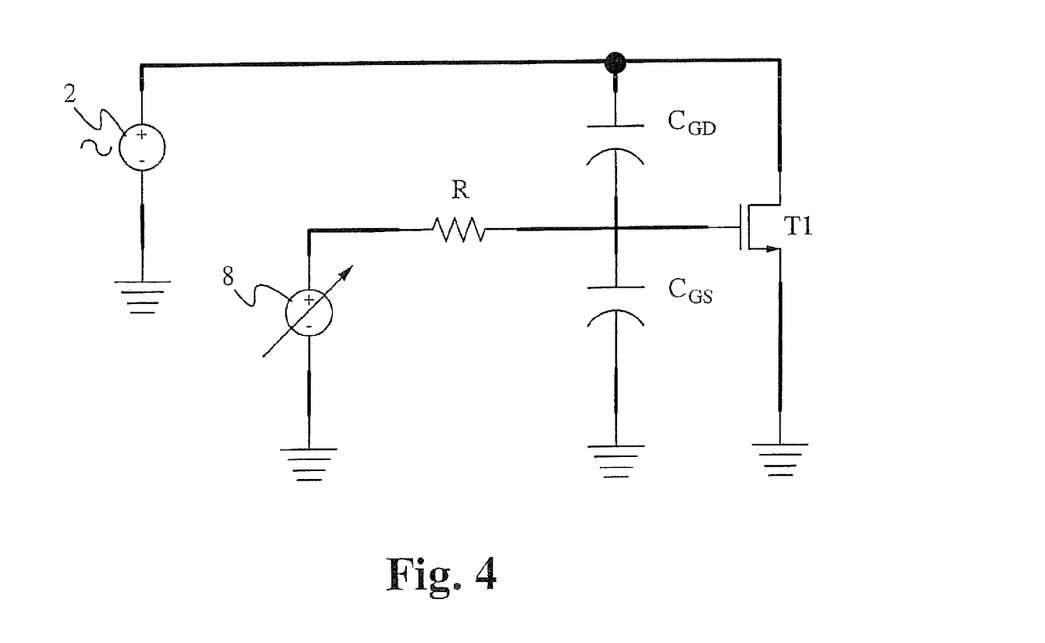
FIG. 4 illustrates the conceptual effect of using the attenuation circuit of FIG. 3 at high frequencies.

FIG. 4 illustrates the conceptual effect of using the attenuation circuit of FIG. 3 at high frequencies, for example at frequencies greater than 30 MHz. The two capacitors $C_{GD}$ and $C_{GS}$ represent parasitic capacitances within the transistor T1, or the parasitic capacitances plus some additional external capacitance. The capacitor divider is used to regulate the voltage applied to the transistor gate at high frequencies. The capacitor divider enables a scaled AC signal supplied from the signal source 2 to be applied to the transistor gate along with the DC bias voltage supplied from the variable voltage source 8. The configuration of FIG. 4 is effective for reducing or eliminating distortion generated by the transistor T1, but only at higher frequencies, such as greater than 30 MHz. For lower frequencies, for example less than 30 MHz, the configuration of FIG. 4 is ineffective at reducing or eliminating distortion generated by the transistor T1. At lower frequencies, the capacitors $C_{GD}$ and $C_{GS}$ effectively become open circuits.

Figure 5:
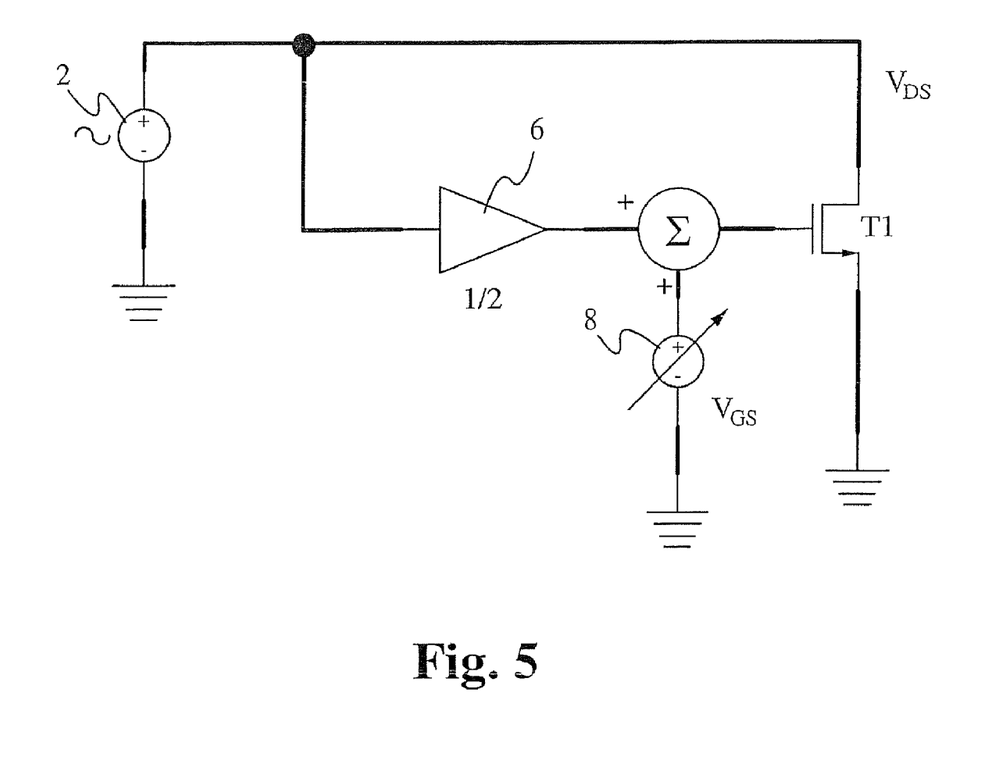
FIG. 5 illustrates a modified version of the attenuation circuit of FIG. 3 where a scaled signal is supplied to the gate of the transistor T1.

FIG. 5 illustrates a modified version of the attenuation circuit of FIG. 3 where a scaled signal is supplied to the gate of the transistor T1. The attenuation circuit of FIG. 5 includes a scaling circuit 6 that scales the input RF signal received by the antenna. Both the scaled signal and the DC bias signal are supplied to the transistor T1. From FIG. 5, the AC input signal is equal to $V_{DS}$. If the AC input signal is scaled by 0.5 and added to the DC bias voltage $V_{GS}$, equation (1) becomes:

$$i_D = (\mu C_{OX} W/L)[(V_{GS} + (V_{DS}/2) - V_T)V_{DS} - (V_{DS}^2)/2)] \quad (2)$$

which simplifies to:

$$i_D = (\mu C_{OX} W/L)[(V_{GS} - V_T)V_{DS}] \quad (3)$$

where it is seen that the second order distortion is eliminated. In practice, the coefficient of $V_{DS}^2$ in equation (1) can vary from 0.5, so elimination of the second order distortion may require a scale factor other than 0.5.

Figure 6:
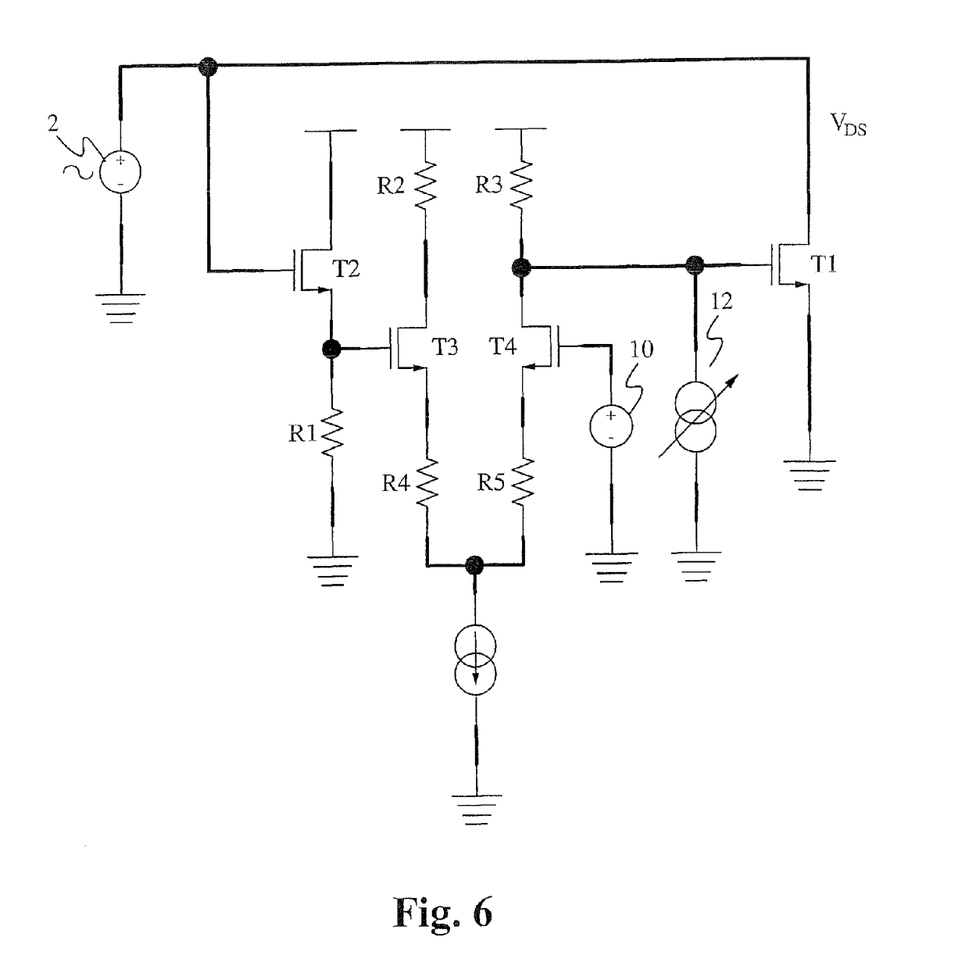
FIG. 6 illustrates a schematic diagram of the attenuation circuit of FIG. 5 according to a first embodiment.

FIG. 6 illustrates a schematic diagram of the attenuation circuit of FIG. 5 according to a first embodiment. Although not shown in FIG. 6, the drain of the transistor T1 is coupled to an amplifier, such as the LNA 4 in FIG. 2. The signal supplied by the signal source 2 is DC coupled to the gate of the transistor T1 through an amplifier having a designed scaling factor. As configured in FIG. 6, the scaling factor is 0.5. It is understood that other scaling factors can be used. The DC coupled amplifier allows operation at arbitrarily low input frequencies for the AC signal received by the antenna. There is no lower frequency limit using the configuration of FIG. 6. The transistors T2, T3, and T4, the resistors R1, R2, R3, R4, and R5, and the fixed bias voltage supply 10 form a DC coupled amplifier that scales the AC signal onto the gate of the transistor T1. The DC coupled amplifier does not limit the lower frequency range of the AC signal because there are no capacitors in the signal path to limit the low end. The transistors T2, T3, and T4, the resistors R1, R2, R3, R4, and R5, and the fixed voltage supply correspond to the scaling circuit 6 in FIG. 4. The amount of the scaling factor is determined by the ratio of the resistors R2 and R3 to the resistors R4 and R5. In the application where the scaling factor is 0.5, the resistance of the resistors R4 and R5 is twice the resistance of the resistors R2 and R3. The resistance of the resistor R1 sets the amount of current that flows through the source follower, transistors T3 and T4. In an exemplary application, the resistance of the resistor R1 is about 10 k ohms, which results in a current through the source follower of about 100 uA.

The scaling circuit must have sufficient bandwidth to pass the application frequency range of the receiver. In an exemplary application, the frequency range is between zero Hz and about 30 MHz. To accommodate this exemplary frequency range, the resistance of the resistor R1 is about 30 k ohms, the resistance of the resistor R2 and the resistor R3 are each about 32 k ohms, and the resistance of the resistor R4 and the resistor R5 are each about 64 k ohms. The voltage source 10 supplies a fixed bias voltage to the gate of the transistor T4. The fixed bias voltage level is sufficient to maintain each of the transistors T2, T3, and T4 in saturation. The variable current source 12 varies from 0-60 uA. Varying the current through the resistor R3 via the current source 12 varies the DC bias voltage supplied to the transistor gate. It is understood that the resistance values, bias voltage, and current described above in relation to FIG. 6 are for exemplary purposes only. It is also understood that the schematic diagram of FIG. 6 is an exemplary configuration of the attenuation circuit conceptually described in relation to FIG. 5, and that alternative circuit configurations are also contemplated. In general, the DC bias voltage supplied to the gate of the transistor T1 regulates the resistance of the transistor T1. Superimposed on the DC bias voltage is the scaled AC signal that cancels the distortion generated by the transistor T1. Although the attenuation circuit of FIG. 6 is configured as an active circuit, it is understood that alternative circuit configurations are contemplated that use passive circuitry.

FIG. 6 represents a simplified schematic diagram to demonstrate the scaling concept without having all biasing elements included. Other than the AC signal supply 2, which conceptually represents the antenna, all of the components of FIG. 6 can be included as part of an integrated circuit. Although each of the transistors is shown in FIG. 6 as N-channel MOSFETs, it is understood that the attenuation circuit can be configured using any type of MOSFETs.

Figure 7:
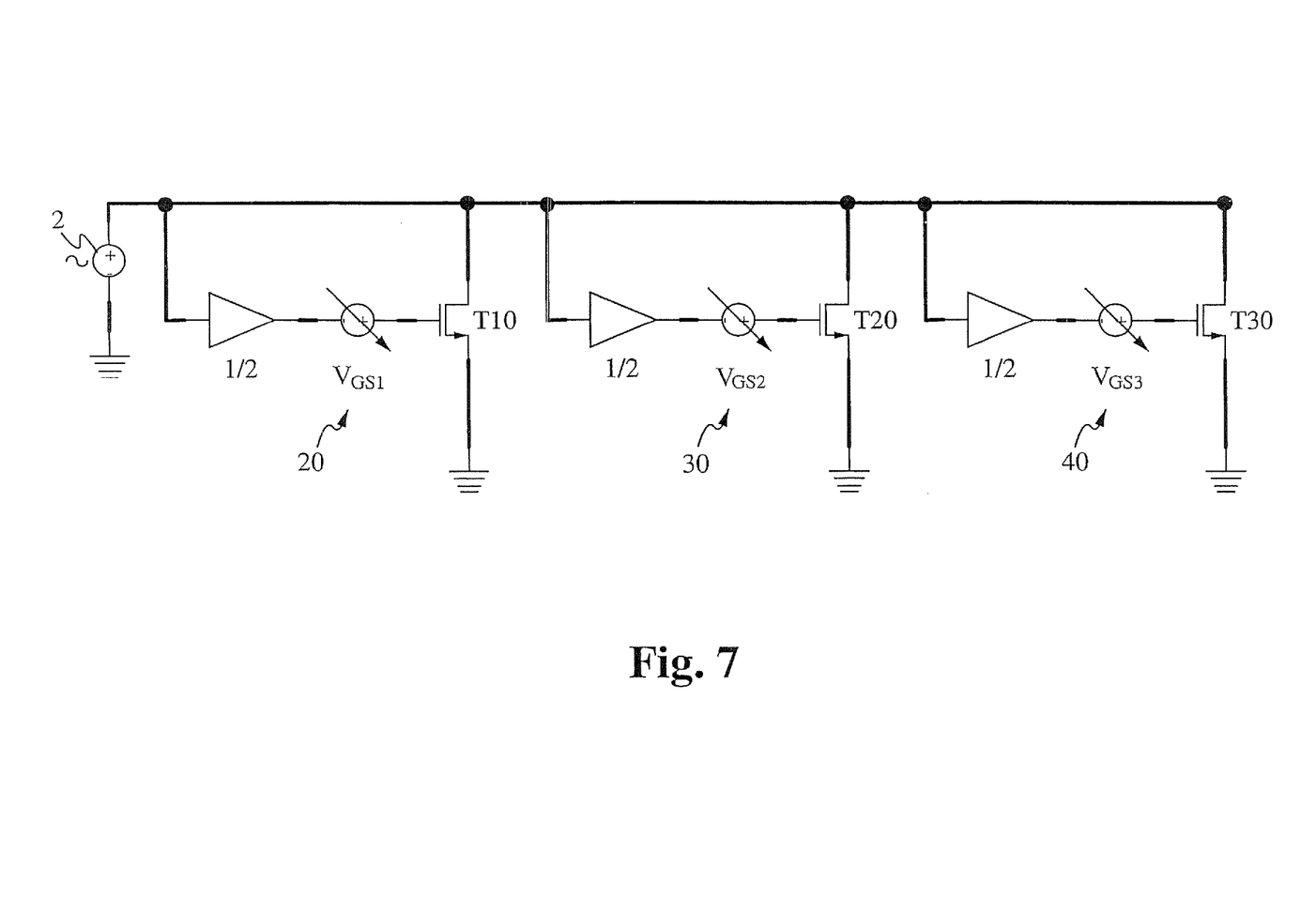
FIG. 7 illustrates a plurality of the attenuator circuits of FIG. 5 configured in cascading stages.

To extend the attenuation range while continuing to minimize the distortion, multiple attenuation circuits are coupled in stages. FIG. 7 illustrates a plurality of the attenuator circuits of FIG. 5 configured in cascading stages. In the exemplary configuration shown in FIG. 7, there are three attenuator circuits 20, 30, and 40 coupled in parallel to the AC signal source 2. It is understood that more or less than three attenuator circuits can be coupled in parallel. Each of the attenuator circuits 20, 30, 40 functions similarly as the attenuator circuit of FIG. 5. The physical dimensions of the transistor used as the variable resistor in each attenuation circuit becomes progressively larger within the cascading stages. For example, the physical dimensions of the transistor T20 are larger than the physical dimensions of the transistor T10, and the physical dimensions of the transistor T30 are larger than the physical dimensions of the transistor T20. As such, the maximum resistance of the transistor T10 is larger than the maximum resistance of the transistor T20, and the maximum resistance of the transistor T20 is larger than the maximum resistance of the transistor T30. In an exemplary application, the maximum resistance of the transistor T10 is about 30 k ohms, the maximum resistance of the transistor T20 is about 18 k ohms, and the maximum resistance of the transistor T30 is about 8 k ohms.

A transistor with the largest maximum resistance is turned on first, which in this case is the transistor T10. Each of the transistors T10, T20, and T30 are turned on sequentially, the order of which is determined by the transistor resistance. The smallest physical-sized transistor, the transistor having the largest resistance, is turned on first, which in this case is the transistor T10. The transistor having the second largest resistance is turned on second, and so on for each stage. Once the transistor T10 is fully turned on, then the transistor T20 is turned on while the transistor T10 remains fully turned on. Once the transistor T20 is fully turned on, then the transistor T30 is turned on while the transistors T10 and T20 remain fully turned on. Each of the transistors T10, T20, and T30 functions similarly as the transistor T1 in FIG. 5.

To understand why staging a series of transistors of increasing width improves the linearity of the attenuator, recall that equations (1), (2), and (3) describe the behavior of an ideal device. In some cases, these equations do not adequately represent the characteristics of a physical device. In particular, in the region where the device is just beginning to turn on, where $V_{GS} \cong V_T$, the drain current $i_D$ becomes a much more non-linear function of $V_{DS}$ and $V_{GS}$. Conversely, for large values of $V_{GS}$, the behavior of a physical device is well modeled by equations (1) through (3), with the exception of the exact value of the constant multiplier of the $V_{DS}^2$ term, as described above.

The ideal equation (3) suggests that as $V_{GS}$ is varied from $V_T$ to some maximum value, the resistance goes from infinite to some value that depends on the dimensions and physical properties of the device, and the distortion is zero over the entire range. In fact, for a real device operating in the region where $V_{GS}-V_T \cong 0V$, significant distortion is generated in the channel.

The circuit of FIG. 7 overcomes this problem by turning on the devices in sequence, from smallest to largest. Beginning with all the devices off, the smallest device, the transistor T10, is turned on. As the transistor T10 passes through the region $V_{GS} \cong V_T$, the non-linear current generated is relatively small, because W/L for this device is small, and the distortion products generated are also small. When the transistor T10 is fully turned on, it has passed into the range where the drain current $i_D$ follows equation (3) and the transistor T10 behaves as a linear resistor.

When the transistor T10 is fully turned on, the transistor T20 begins to be turned on. As the transistor T20 passes through region $V_{GS} \cong V_T$, it also contributes some distortion due to non-linearity of the drain current. However, the transistor T20 is shunted by the transistor T10, which is now operating as a highly linear resistor. If the dimensions of the transistor T20 and the transistor T10 are scaled properly, the non-linear drain current in the transistor T20 is small compared to the linear drain current in the transistor T10, and the result is negligible additional distortion due to the transistor T20.

When the transistor T20 becomes fully turned on, the transistor T20, in parallel with the transistor T10, forms a smaller value linear resistor, which results in increased attenuation of the AC signal. The process is repeated as the transistor T30 is turned on, with the linear drain current in the transistor T10 and the transistor T20 in parallel dominating the non-linear drain current generated in the transistor T30 when it is in the range $V_{GS} \cong V_T$.

More and more transistors can be cascaded in this manner to further reduce the shunt resistance and increase the attenuation range of the attenuation circuit. Cascading the transistors enables a broad range of attenuation while minimizing the distortion product.

Each of the attenuation circuits 20, 30, and 40 are independently controlled, by independently adjusting each of the variable resistance scaling voltages $V_{GS}$. In some embodiments, a control circuit is configured to provide a single control voltage. As the control voltage is increased, separate independent scaling voltages are generated for each cascaded transistor such that each of the transistors is sequentially turned on in stages to achieve a desired overall shunt resistance and attenuation level. No scaling voltage is supplied to the transistor T20 until the transistor T10 is fully turned on, and no scaling voltage is supplied to the transistor T30 until both the transistor T10 and the transistor T20 are fully turned on.

In the exemplary application described above, the attenuation circuit of FIG. 5 is applied to the AM signal path of a radio receiver. The range is from zero Hz to 30 MHz, which includes the AM radio band. When the application frequency exceeds 30 MHz, such as the FM radio band, then the parasitic capacitances of the transistor itself, as in FIG. 4, perform the signal attenuation without need of the scaling circuit. In general, the attenuation circuit can be used to attenuate the input signal to any amplifier, including amplifiers used in radio receivers. The attenuation circuit using a scaling circuit is a general purpose, low distortion attenuator applicable from zero Hz up to some higher frequency, in this case 30 MHz. The attenuation circuit is advantageous for those applications that experience in-band distortion.

The attenuator has been described in terms of specific embodiments incorporating details to facilitate the understanding of the principles of construction and operation of the attenuator. Such references, herein, to specific embodiments and details thereof are not intended to limit the scope of the claims appended hereto. It will be apparent to those skilled in the art that modifications can be made in the embodiments chosen for illustration without departing from the spirit and scope of the attenuator.

What is claimed is:

1. A method of attenuating a signal, the method comprising:
    a. attenuating the signal using a field-effect transistor as a variable resistor, the field-effect transistor having a source, a gate and a drain, the source and drain being coupled across the attenuated signal;
    b. scaling the attenuated signal; and
    c. combining the scaled attenuated signal with a variable DC bias signal and applying the combination to the gate of the field-effect transistor, thereby adjusting a resistance of the field-effect transistor attenuating the signal responsive to the combination of the variable DC bias signal and the scaled attenuated signal.

2. The method of claim 1 wherein the coupled scaling circuit comprises a DC coupled amplifier.

3. The method of claim 1 wherein the signal comprises a radio frequency signal.

4. The method of claim 1 wherein a frequency of the signal ranges from about zero Hz to about 30 MHz.

5. The method of claim 1 wherein the field-effect transistor comprises a metal-oxide-semiconductor field-effect transistor.

6. The method of claim 1 further comprising receiving the signal by an antenna.

7. The method of claim 1 further comprising supplying the attenuated signal to an amplifier coupled as the scaling circuit.

8. The method of claim 1 further comprising adjusting the DC bias signal to adjust the resistance of the field-effect transistor, thereby adjusting the attenuation of the signal.

9. The method of claim 1 wherein the coupled scaling circuit comprises an active circuit.

10. The method of claim 1 wherein the coupled scaling circuit comprises a passive circuit.

11. The method of claim 1 wherein the field-effect transistor is coupled to provide a shunt resistance to the signal.

12. The method of claim 1 wherein the field-effect transistor, the scaling circuit, and the variable DC bias circuit form an attenuation circuit, and the method further comprises coupling a plurality of attenuation circuits in parallel, each of the field-effect transistors in the plurality of attenuation circuits having a different maximum resistance, and wherein the signal is attenuated according to a shunt resistance resulting from an instantaneous resistance of all of the field-effect transistors of the attenuation circuits coupled in parallel.

13. The method of claim 12 wherein the plurality of attenuation circuits are configured as cascading stages, the field-effect transistors plurality of stages being turned on sequentially in descending order of maximum resistance starting with a first field-effect transistor having a highest maximum resistance and ending with a last field-effect transistor having a lowest maximum resistance.

14. The method of claim 13 wherein the field-effect transistor in each successive stage is turned on only after the transistor in the previous stage is fully turned on.

15. The method of claim 1 wherein the scaling is selected to reduce distortion of the attenuated signal in comparison to the distortion that would be obtained by simply applying the variable DC bias signal to the gate of the field-effect transistor.

16. The method of claim 1 wherein the scaling is a fixed fraction of the attenuated signal selected to reduce distortion of the attenuated signal in comparison to the distortion that would be obtained by simply applying the variable DC bias signal to the gate of the field-effect transistor.

* * * * *